United States Patent
Li et al.

(10) Patent No.: US 12,114,418 B2
(45) Date of Patent: Oct. 8, 2024

(54) ELECTRONIC MODULE AND ELECTRONIC DEVICE

(71) Applicant: HUAWEI TECHNOLOGIES CO., LTD., Guangdong (CN)

(72) Inventors: Yongyao Li, Shenzhen (CN); Shibin Xu, Dongguan (CN); Wei Kang, Dongguan (CN); Feng Wang, Shenzhen (CN); Xue Feng, Shenzhen (CN); Jiang Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 240 days.

(21) Appl. No.: 17/852,581

(22) Filed: Jun. 29, 2022

(65) Prior Publication Data
US 2022/0330417 A1 Oct. 13, 2022

Related U.S. Application Data

(63) Continuation of application No. PCT/CN2020/113830, filed on Sep. 7, 2020.

(30) Foreign Application Priority Data

Dec. 30, 2019 (CN) .......................... 201911398770.5

(51) Int. Cl.
*H05K 1/00* (2006.01)
*H05K 1/02* (2006.01)
*H05K 3/34* (2006.01)

(52) U.S. Cl.
CPC ......... *H05K 1/0215* (2013.01); *H05K 3/3436* (2013.01)

(58) Field of Classification Search
CPC .......................... H05K 1/0215; H05K 3/3436
See application file for complete search history.

(56) References Cited

U.S. PATENT DOCUMENTS

| 5,518,964 A | 5/1996 | Distefano et al. |
| 6,270,357 B1 | 8/2001 | Pfaff |

(Continued)

FOREIGN PATENT DOCUMENTS

| CN | 101944523 A | 1/2011 |
| JP | S5789284 A | 6/1982 |

(Continued)

OTHER PUBLICATIONS

Chinese Notice of Allowance for Application No. 201911398770.5 dated Oct. 9, 2022, 4 pages.

(Continued)

*Primary Examiner* — Pete T Lee

(57) ABSTRACT

This application provides an electronic module and an electronic device. The electronic module includes a first component, a second component, and a plurality of terminals. The first component includes a package substrate and a chip mounted on the package substrate. The second component includes a circuit board and a mount base mounted on the circuit board. Each terminal includes a body part, and a first bent part and a solder ball that are respectively connected to two opposite ends of the body part. In each terminal, the body part passes through and is fastened to the mount base, the first bent part presses against a corresponding first solder pad on the package substrate, and the solder ball is connected to a corresponding second solder pad on the circuit board.

11 Claims, 12 Drawing Sheets

(56) References Cited

U.S. PATENT DOCUMENTS

| | | | |
|---|---|---|---|
| 7,057,295 B2* | 6/2006 | Ju | H05K 3/325 |
| | | | 257/784 |
| 2005/0236719 A1 | 10/2005 | Ju | |
| 2009/0102041 A1* | 4/2009 | Ju | H05K 7/1069 |
| | | | 438/117 |
| 2011/0003492 A1* | 1/2011 | Ihara | H05K 3/4015 |
| | | | 439/81 |
| 2012/0252239 A1 | 10/2012 | Ju et al. | |
| 2012/0258636 A1 | 10/2012 | Horikawa | |
| 2014/0183732 A1 | 7/2014 | Huang et al. | |
| 2016/0276763 A1* | 9/2016 | Rathburn | H01R 43/205 |
| 2016/0302306 A1* | 10/2016 | Chang | H05K 1/111 |
| 2017/0354031 A1* | 12/2017 | Aoki | H05K 3/341 |
| 2019/0157253 A1* | 5/2019 | Browning | G11C 5/04 |

FOREIGN PATENT DOCUMENTS

| | | |
|---|---|---|
| JP | H0431282 A | 2/1992 |
| JP | 2002124742 A | 4/2002 |
| JP | 2011171168 A | 9/2011 |
| JP | 2016119456 A | 6/2016 |
| JP | 2018174018 A | 11/2018 |
| WO | 2005057652 A2 | 6/2005 |

OTHER PUBLICATIONS

Chinese Office Action for Application No. 201911398770.5 dated May 18, 2022, 5 pages.
PCT International Search Report for PCT/CN2020/113830 dated Dec. 30, 2019, 12 pages.
Japan Office Action Notice of Reasons for Rejection for Application No. 2022-540550 dated Jul. 18, 2023, 9 pages.

* cited by examiner

ELECTRONIC MODULE AND ELECTRONIC DEVICE

CROSS-REFERENCE TO RELATED APPLICATIONS

This application is a continuation of International Application No. PCT/CN 2020/113830, filed on Sep. 7, 2020, which claims priority to Chinese Patent Application No. 201911398770.5, filed on Dec. 30, 2019. The disclosures of the aforementioned applications are hereby incorporated by reference in their entireties.

TECHNICAL FIELD

This application relates to the field of electronic technologies, and in particular, to an electronic module and an electronic device.

BACKGROUND

When two components in an electronic module are assembled, one of the components (for example, a component formed by mounting a chip on a package substrate) needs to slide to a specified position relative to the other component along a certain direction (for example, the package substrate is mounted on a circuit board in a sliding manner) and then is locked, and signal connection between the two components is implemented by using a plurality of terminals. Each terminal is provided with a bent part, and is elastically in contact with the component by using the bent part.

However, in the conventional technology, an included angle between an extension direction of the bent part of the terminal and a relative sliding direction of the two components during assembly is usually 45°. Therefore, in a relative sliding process of the two components, a bent part of each terminal easily deviates under action of a friction force of a component in contact, resulting that a spacing between different terminals is changed. When data is transmitted between the two components by using the terminals, a signal can be easily distorted, resulting in poor signal integrity, especially when the data is transmitted at a high speed.

FIG. 1 is a schematic diagram of an electronic module in the conventional technology. A component 10 includes a package substrate 12 and a chip 11 mounted on the package substrate 12. A component 20 includes a circuit board 22 and a mount base 21 located on the circuit board 22. The package substrate 12 is electrically connected to the circuit board by using a plurality of terminals 30 that pass through the mount base 21. As shown in FIG. 2, each terminal 30 includes a body part 32, a bent part 31 connected to one end of the body part 32, and a solder ball 33 connected to the other end of the body part 32. The body part 32 is fastened to the mount base 21, the solder ball 33 is connected to a solder pad on the circuit board 22, and an extension direction of an orthographic projection of the bent part 31 on a mount surface S1 of the circuit board 22 is an extension direction T of the bent part 31. FIG. 3a shows a top view of some terminals 30 in FIG. 1 before the package substrate 12 is mounted. With reference to FIG. 1 and FIG. 3a, when the package substrate 12 is mounted on the mount base 21 in a sliding manner along a P direction, an included angle between an extension direction T of the bent part 31 and the P direction is usually 45°. After the package substrate 12 is mounted, statuses of the terminals in FIG. 3a are shown in FIG. 3b. If distances between the bent parts 31 of different terminals 30 are changed, integrity of a signal can be poor when the signal is transmitted by using the terminals 30.

SUMMARY

This application provides an electronic module and an electronic device, to resolve a technical problem that a spacing between terminals of two components changes when the two components slide relative to each other, so that signal integrity is good when data is transmitted between the two components at a high speed by using the terminals.

According to a first aspect, an electronic module is provided. The electronic module may be applied to an electronic device such as a mobile phone, a computer, or a switch. The electronic module includes a first component, a second component, and a plurality of terminals. When the first component and the second component are assembled, the first component is fitted with the second component in a sliding manner along a first preset direction, and locked at a first specified position relative to the second component, where a surface of the first component facing the second component is provided with a plurality of first solder pads; the plurality of terminals one-to-one correspond to at least a portion of the plurality of first solder pads; each terminal includes a body part and a first bent part connected to the body part; the body part is fastened to the second component, and the first bent part presses against a corresponding first solder pad; when the first component slides relative to the second component along the first preset direction, a torque of a friction force applied by the first component to a first bent part of each terminal is less than or equal to that applied by the body part to the first bent part. Therefore, for each terminal, the first component is difficult to drive the first bent part to rotate around a corresponding body part, a distance between first bent parts of different terminals is not easily changed, differential impedance of each terminal pair is not easily increased, and crosstalk between different terminal pairs is not easily increased. When a signal is transmitted between the first component and the second component by using the terminals, good SI (Signal Integrity) performance can also be maintained at a high speed.

For example, in a specific implementation, in each terminal, when the body part and the first bent part are both made of common materials such as copper alloy and phosphor bronze, and an included angle between a straight line on which an extension direction of the first bent part is located and a straight line on which the first preset direction is located is between 0° and 15°, a small arm of force corresponding to the friction force applied by the first component to the first bent part can be ensured. The torque applied by the friction force to the first bent part of each terminal is insufficient to overcome the torque applied by the body part to the first bent part.

When the terminals are specifically disposed, arrangement of the terminals affects a force applied to the first component. For example, when the plurality of terminals are distributed in an array, in each row of terminals distributed along the first preset direction, first bent parts of some terminals and first bent parts of the other terminals are disposed face to face or back to back. In this way, at least some components of friction forces applied by a same row of terminals to the first component are opposite. Therefore, a portion of friction forces applied to the first component by the terminals of the first bent parts facing opposite directions can be offset, to ensure that the first component can be uniformly stressed as much as possible, and avoid dislocation between the first bent part of each terminal and a corresponding first solder pad in the first component.

In a specific implementation, in each row of the terminals distributed along the first preset direction, a quantity of terminals of the first bent parts facing the first preset direction is equal to a quantity of terminals of the first bent parts away from the first preset direction, to ensure that friction force applied to the first component by a same row of terminals of the first bent parts facing different directions can be fully offset.

To further improve the SI performance when the signal is transmitted between the first component and the second component by using the terminals, in a specific implementation, in each row of the terminals distributed along the first preset direction, the terminals of the first bent parts facing the first preset direction are continuously disposed, and the terminals of the first bent parts away from the first preset direction are continuously disposed, to ensure that when the first bent parts face different terminals, a distance between the body parts and a distance between the first bent parts are becoming even.

The first component may be in a plurality of forms. In a specific implementation, the first component includes a package substrate and a chip; the package substrate includes a substrate body and the plurality of first solder pads; the plurality of first solder pads and the chip are respectively disposed on two opposite surfaces of the substrate body; and the chip is electrically connected to the plurality of first solder pads. In addition, the first component may be a parasitic circuit board provided with a first solder pad.

Correspondingly, the second component may be in a plurality of forms. In a specific implementation, the second component includes a circuit board and a mount base. The circuit board includes a circuit board body and a plurality of second solder pads disposed on the circuit board body. The plurality of terminals are one-to-one connected to the plurality of second solder pads. The mount base is connected to the circuit board. Body parts of the plurality of terminals pass through the mount base and are fastened to the mount base.

The first bent part is disposed at one end of the body part that faces the first component. In addition, in a specific implementation, each terminal further includes a second bent part that is connected to one end of the body part and that is away from the first bent part, and a second bent part of each terminal presses against one second solder pad. The mount base is fitted with the circuit board body in a sliding manner along a second preset direction, and locked in a second specified position relative to the circuit board body. When the mount base slides relative to the circuit board body along the second preset direction, a torque of a friction force applied by the circuit board body to the second bent part of each terminal is less than or equal to that applied by the body part to the second bent part, so that the second bent part is difficult to rotate relative to the body part, to further ensure the SI performance when the signal is transmitted by using the terminals.

For example, in a specific implementation, in each terminal, when the body part and the second bent part are both made of common materials such as copper alloy and phosphor bronze, and an included angle between a straight line on which an extension direction of the second bent part of each terminal is located and a straight line on which the second preset direction is located is between 0° and 15°, a small arm of force corresponding to the friction force applied by the circuit board body to the second bent part can be ensured. The torque applied by the friction force to the second bent part of each terminal is insufficient to overcome the torque applied by the body part to the second bent part.

To ensure that each terminal is uniformly stressed and each terminal is accurately aligned with a corresponding first solder pad and a corresponding second solder pad, in a specific implementation, in each terminal, the extension direction of the first bent part is opposite to the extension direction of the second bent part.

In a specific implementation, the circuit board further includes a plurality of traces formed on the circuit board body. The plurality of traces and at least a portion of the terminals are in signal connection in a one-to-one correspondence. When the plurality terminals are distributed in an array, each trace extends along two adjacent columns of terminals and/or a middle position between the two adjacent columns of terminals, and is parallel to an arrangement direction of terminals on two sides of the trace. This prevents the traces from being too close to terminals on one side and does not affect performance of the terminals.

In a specific implementation, in at least one group of two opposite sides of the package substrate, the middle of each side is positioned and connected to the mount base. Each terminal is closer to a corresponding positioning bump, to reduce an accumulated error of alignment between the terminal and the first solder pad.

According to a second aspect, an electronic device is provided. The electronic device may be a mobile phone, a computer, or a switch. The electronic device includes a storage module and the electronic module described in the foregoing technical solutions. The first component in the electronic module is electrically connected to the storage module. When the first component slides relative to the second component along the first preset direction, the torque of the friction force applied by the first component to the first bent part of each terminal is less than or equal to that applied by the body part to the first bent part. For each terminal, the first component is difficult to drive the first bent part to rotate around the corresponding body part, and the distance between first bent parts of different terminals is not easily changed. When a signal is transmitted between the first component and the second component by using the terminals, good SI performance can also be maintained at a high speed, to improve performance of the electronic device.

BRIEF DESCRIPTION OF DRAWINGS

FIG. 4b is a partial enlarged view of a position A in FIG. 4a;

FIG. 4c is a partial enlarged view of a position B in FIG. 4a;

FIG. 5 is a bottom view of a package substrate in FIG. 4a;

FIG. 6 is a schematic diagram of a structure of a mount base in FIG. 4a;

FIG. 7 is a top view of a circuit board in FIG. 4a;

DESCRIPTION OF EMBODIMENTS

To make objectives, technical solutions, and advantages of this application clearer, the following further describes this application in detail with reference to accompanying drawings.

For ease of understanding of an electronic module provided in embodiments of this application, an application scenario of the electronic module is first described. The electronic module may be applied to an electronic device such as a mobile phone, a computer, or a switch.

Figure 1:
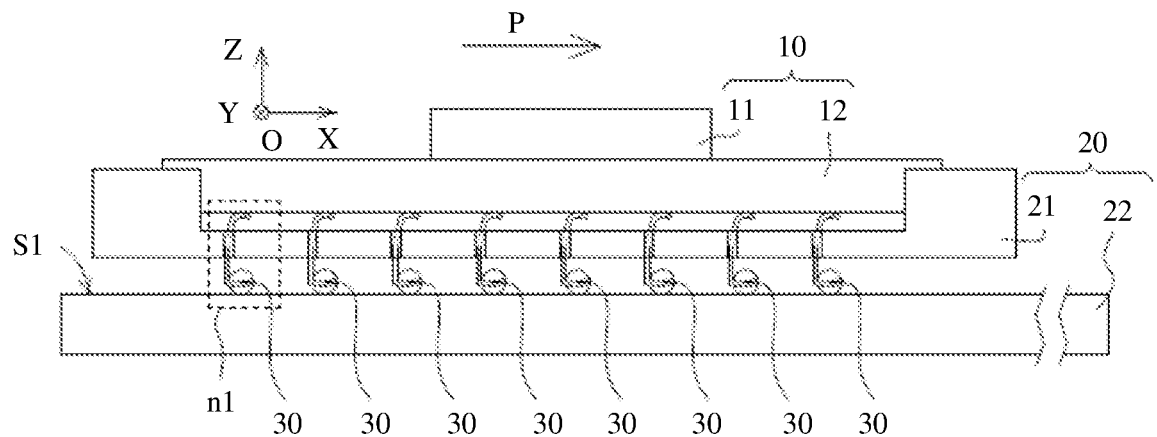
FIG. 1 is a schematic diagram of an electronic module in the conventional technology.
Figure 2:
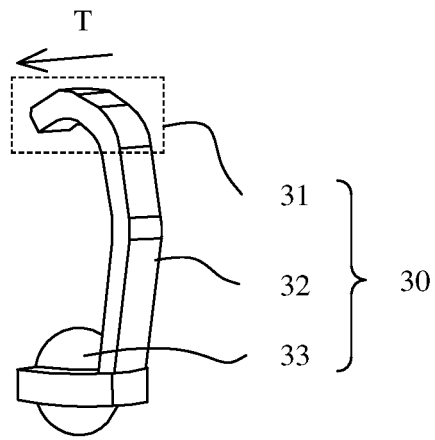
FIG. 2 is a schematic diagram of a structure of a terminal in FIG. 1.

FIG. 1 is a schematic diagram of assembling a chip in an existing electronic module on a circuit board by using a package substrate and a mount base. The existing electronic module includes a component 10, a component 20, and a plurality of terminals 30. The component 10 includes a package substrate 12 and a chip 11 mounted on the package substrate 12. The component 20 includes a circuit board 22 and a mount base 21 located on the circuit board 22. The mount base 21 is provided with a mounting slot (that is, Socket). FIG. 2 is a schematic diagram of a structure of the terminal 30 in FIG. 1. As shown in FIG. 2, each terminal 30 includes a body part 32, a bent part 31 connected to one end of the body part 32, and a solder ball 33 connected to the other end of the body part 32. As shown in FIG. 1, the plurality of terminals 30 pass through the body part 32 and are mounted on the mount base 21. Generally, the terminals 30 are distributed in an array. In each terminal 30, the bent part 31 presses against one solder pad (not shown in FIG. 1, a surface of the solder pad is parallel to an XOY surface) on a bottom surface of the package substrate 12, and the solder ball 33 is welded with a solder pad (not shown in FIG. 1, a surface of the solder pad is parallel to the XOY surface) on the circuit board 22.

With reference to FIG. 1 and FIG. 2, an extension direction of an orthographic projection of the bent part 31 of each terminal 30 on a mount surface S1 (the mount surface S1 is parallel to the XOY surface) of the circuit board 22 is defined as an extension direction (represented by T) of the bent part 31 of the terminal 30. When the component 10 and the component 20 are assembled, one end of the package substrate 12 tilts down along a sliding direction of the package substrate 12 relative to the mount base 21, and the package substrate 12 is pushed to slide relative to the mount base 21 along a mounting direction P (a positive direction of the X-axis in FIG. 1) until the package substrate 12 touches a wall of the mounting slot of the mount base 21, and then the other end of the package substrate 12 is pressed down into the mounting slot of the mount base 21.

Figure 3A:
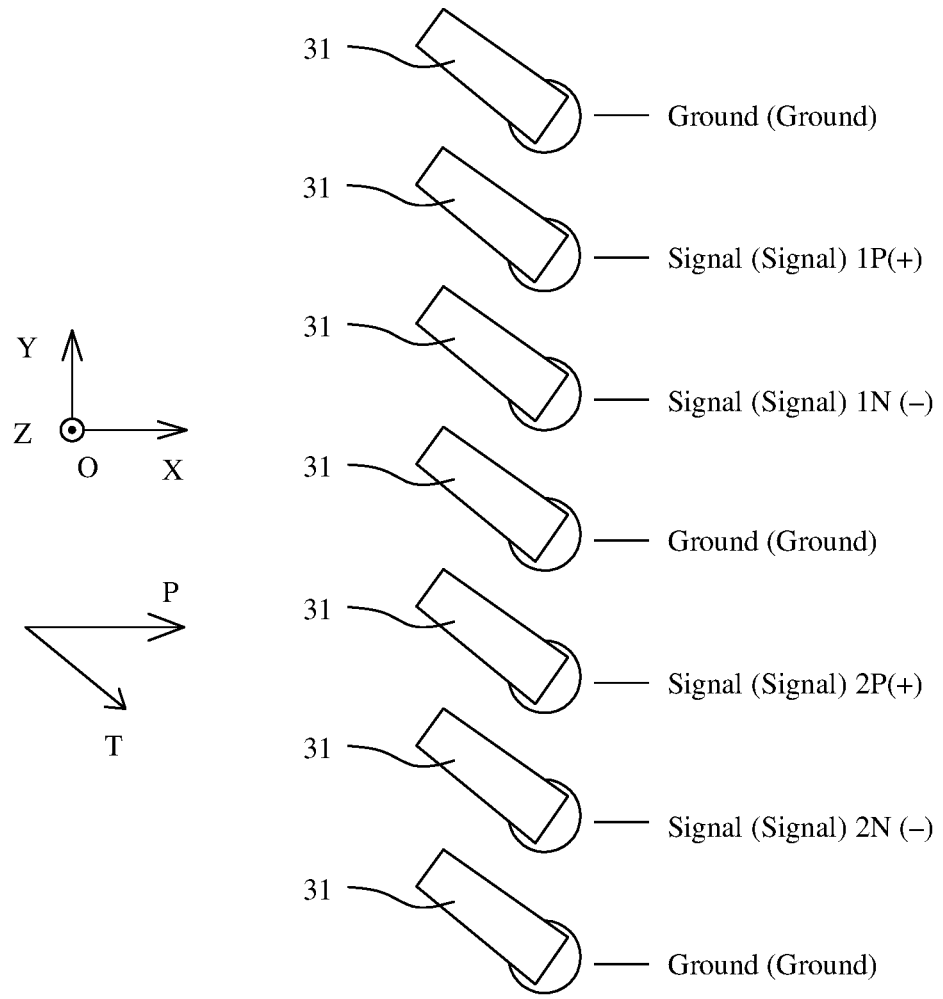
FIG. 3a is an enlarged view of a top view of terminals in an n1 column in FIG. 1 when a package substrate is not mounted on a mount base.

FIG. 3*a* is an enlarged view of a top view (a view observed from a negative direction of the Z-axis) of terminals 30 in an n1 column in FIG. 1 when the package substrate 12 is not mounted on the mount base 21. It can be seen from FIG. 3*a* that along the negative direction of the Y-axis, the plurality of terminals 30 in the n1 column are sequentially: a ground terminal ground (Ground), a signal terminal signal (Signal) 1P(+), a signal terminal signal (Signal) 1N (−), a ground terminal ground (Ground), a signal terminal signal (Signal) 2P(+), a signal terminal signal (Signal) 2N(−), and a ground terminal ground (Ground). The signal terminal signal (Signal) 1P(+) and the signal terminal signal (Signal) 1N(−) form a P/N terminal pair. The signal terminal signal (Signal) 2P(+) and the signal terminal signal (Signal) 2N(−) form a P/N terminal pair. In a natural state, extension directions of the bent parts 31 of the terminals 30 in the n1 columns are parallel to each other, and are all located in the T direction. This can ensure that a distance between the bent parts 31 of every two adjacent terminals 30 in the n1 columns of terminals 30 is moderate. In addition, with reference to FIG. 1, when the package substrate 12 is to be mounted on the mount base 21, the package substrate 12 is pushed to slide relative to the mount base 21 along the mounting direction P. The bent part 31 of each terminal 30 is subject to a friction force applied by the package substrate 12 along the mounting direction P. In the conventional technology, because there is an included angle (for example, the included angle is 45°) between the extension direction T of the bent part 31 of each terminal 30 and the mounting direction P, the bent part 31 easily loses balance, and easily rotates (a rotation axis is parallel to the Z-axis) under action of a friction force of the solder pad. Then the bent part 31 of each terminal 30 deviates to different extents in different directions under action of a friction force of a solder pad on the package substrate 12.

Figure 3B:
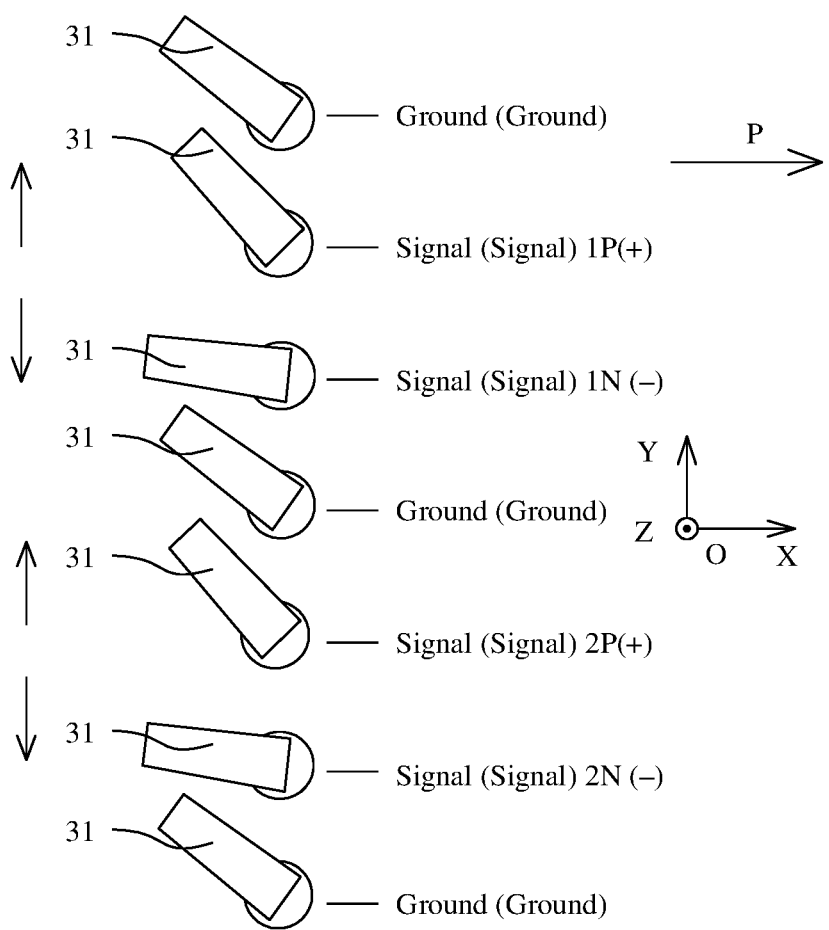
FIG. 3b is an enlarged view of a top view of terminals in an n1 column in FIG. 1 after a package substrate is mounted on a mount base.

FIG. 3*b* is an enlarged view of a top view of terminals in an n1 column after the package substrate 12 slides to a specified position relative to the mount base 21 along the mounting direction P and is mounted in the mounting slot. In the plurality of terminals 30 in the n1 columns in FIG. 1, when the bent part 31 of the signal terminal signal (Signal) 1P(+) is far away from the bent part 31 of the signal terminal signal (Signal) 1N(−), a differential impedance of the terminal pair of the signal terminal signal (Signal) 1P(+) and the signal terminal signal (Signal) 1N(−) is increased. When the bent part 31 of the signal terminal signal (Signal) 2P(+) is close to the bent part 31 of the signal terminal signal (Signal) 1N(−), crosstalk between different P/N terminal pairs is increased. Due to the foregoing two factors, when data is transmitted between the chip 11 and the circuit board 22 by using the terminal 30, a signal is easily distorted. Especially, when the data is transmitted at a high speed, the signal is seriously distorted, that is, signal integrity (SI) performance is deteriorated, and the data can only be transmitted at a speed below 25 Gbps.

To resolve the foregoing technical problem, an embodiment of this application provides an electronic module.

Figure 4A:
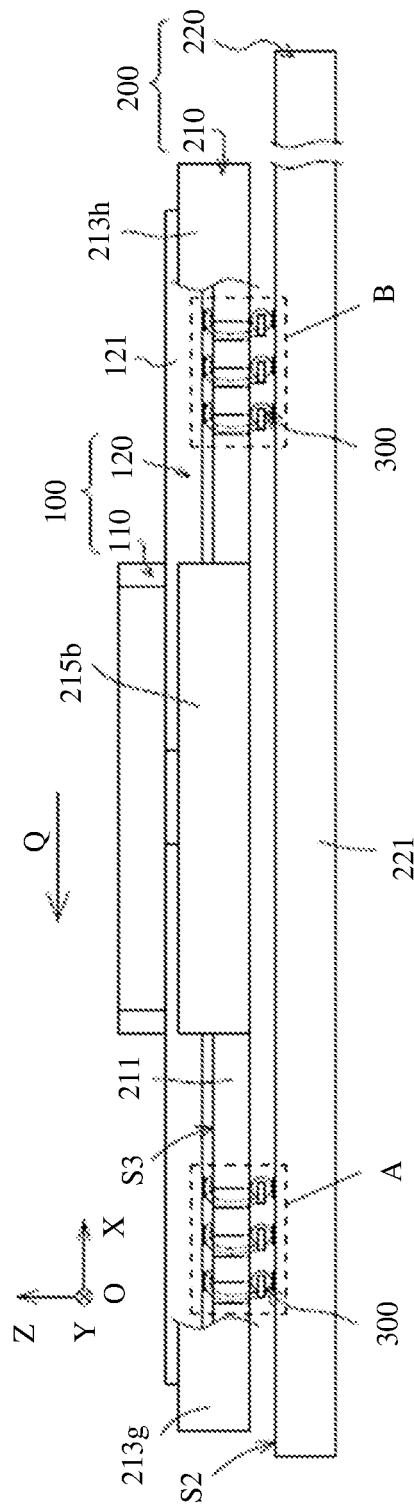
FIG. 4a is a schematic diagram of an electronic module according to an embodiment of this application.

For example, FIG. 4*a* is a schematic diagram of assembling a first component in an electronic module provided in embodiments of this application on a second component. The electronic module provided in this embodiment of this application includes a first component 100, a second component 200, and a plurality of terminals 300. The first component 100 includes a chip 110 and a package substrate 120. The chip 110 is located on a side of the package substrate 120 facing a positive direction of the Z-axis. The chip 110 may be a central processing unit (CPU), a cache, or the like. The second component 200 includes a mount base 210 and a circuit board 220. The mount base 210 is disposed on a side of the circuit board 220 facing the positive direction of the Z-axis, and the package substrate 120 is mounted on a side of the mount base 210 that is away from the circuit board 220. Each terminal 300 passes through the mount base 210, to implement signal connection between the package substrate 120 and the circuit board 220.

Figure 5:
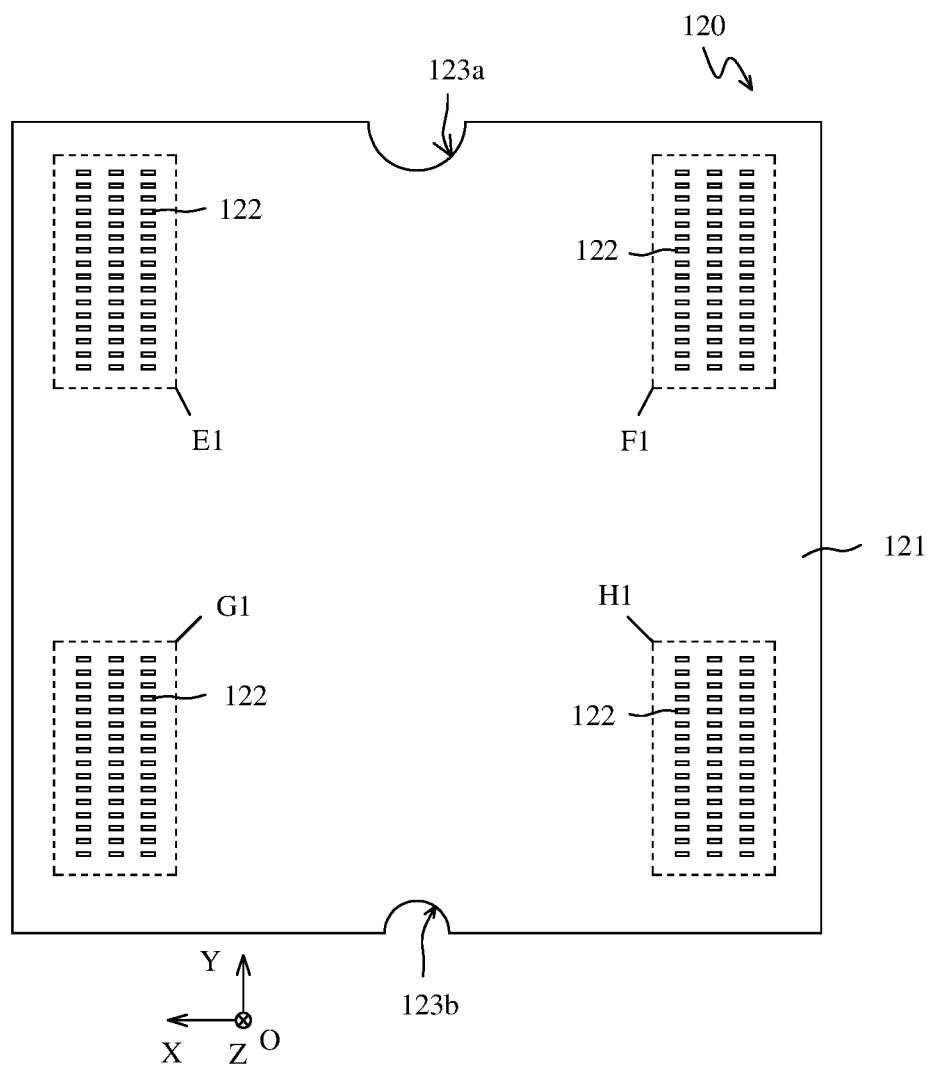

For example, FIG. 5 is a bottom view (a view observed from a direction of the Z-axis) of the package substrate 120 in FIG. 4a. The package substrate 120 includes a substrate body 121 and a plurality of first solder pads 122 distributed on a bottom surface (a surface in a negative direction of the Z-axis, for example, the surface is parallel to an XOY surface) of the substrate body 121. For example, the plurality of first solder pads 122 are divided into four groups, and the four groups of the first solder pads 122 are one-to-one distributed in an area E1, an area F1, an area G1, and an area H1 of corners at the bottom surface of the substrate body 121. Each group of the first solder pads 122 are distributed in an array. A row direction is defined as a direction of the X-axis, and a column direction is defined as a direction of the Y-axis. Each row of the first solder pads 122 in the area E1 is aligned with one row of the first solder pads 122 in the area F1, each row of the first solder pads 122 in the area G1 is aligned with one row of the first solder pads 122 in the area H1, and each column of the first solder pads 122 in the area E1 is aligned with one column of first solder pads 122 in the area G1, and each column of the first solder pads 122 in the area F1 is aligned with one column of the first solder pads 122 in the area H1. However, the foregoing distribution manner of each group of the first solder pads 122 is merely an example, and each group of the first solder pads 122 may also be distributed in another manner. For example, all the first solder pads 122 are continuously disposed, and distributed in an array as a whole. The chip 110 is mounted on a top surface (a surface in the positive direction of the Z-axis) of the substrate body 121. In addition, the chip 110 is connected to some contacts on the substrate body 121 by using pins or the like, so that the chip 110 may be electrically connected to a plurality of first solder pads 122 on the other side of the substrate body 121. An electrical connection between the chip 110 and the first solder pads 122 may be a common connection manner known in the conventional technology. The middles of two opposite sides of the substrate body 121 that are parallel to the X-axis are provided with positioning depressions (123a and 123b) that are depressed inward to the substrate body 121.

Figure 6:
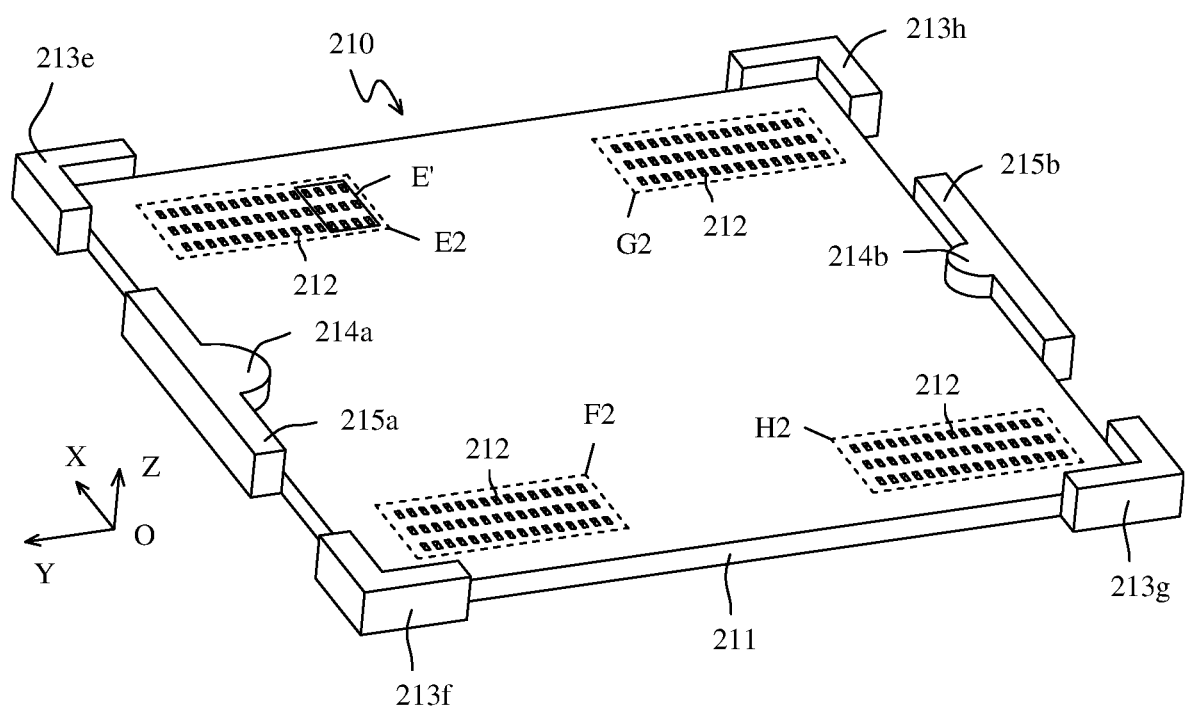

For example, FIG. 6 is a schematic diagram of a structure of the mount base 210 in FIG. 4a. The mount base 210 includes a plate-shaped base body 211, stopper baffle plates (213e, 213f, 213g, and 213h) located at edges of corners of the base body 211, positioning bumps (214a and 214b) located on the middle of two opposite sides parallel to the X-axis, and reinforcing structures (215a and 215b) separately extending along the two opposite sides parallel to the X-axis. The reinforcing structures (215a and 215b) can strengthen structural strength of the positioning bumps (214a and 214b) and can also preliminarily stop the substrate body 121. For example, two opposite surfaces of the base body 211 in a thickness direction are both parallel to the XOY surface. Positions of the base bodies 211 close to four corners are separately provided with an area E2, an area F2, an area G2, and an area H2. A group of terminal fastening cavities 212 are distributed in an array in each of the four areas.

Figure 7:
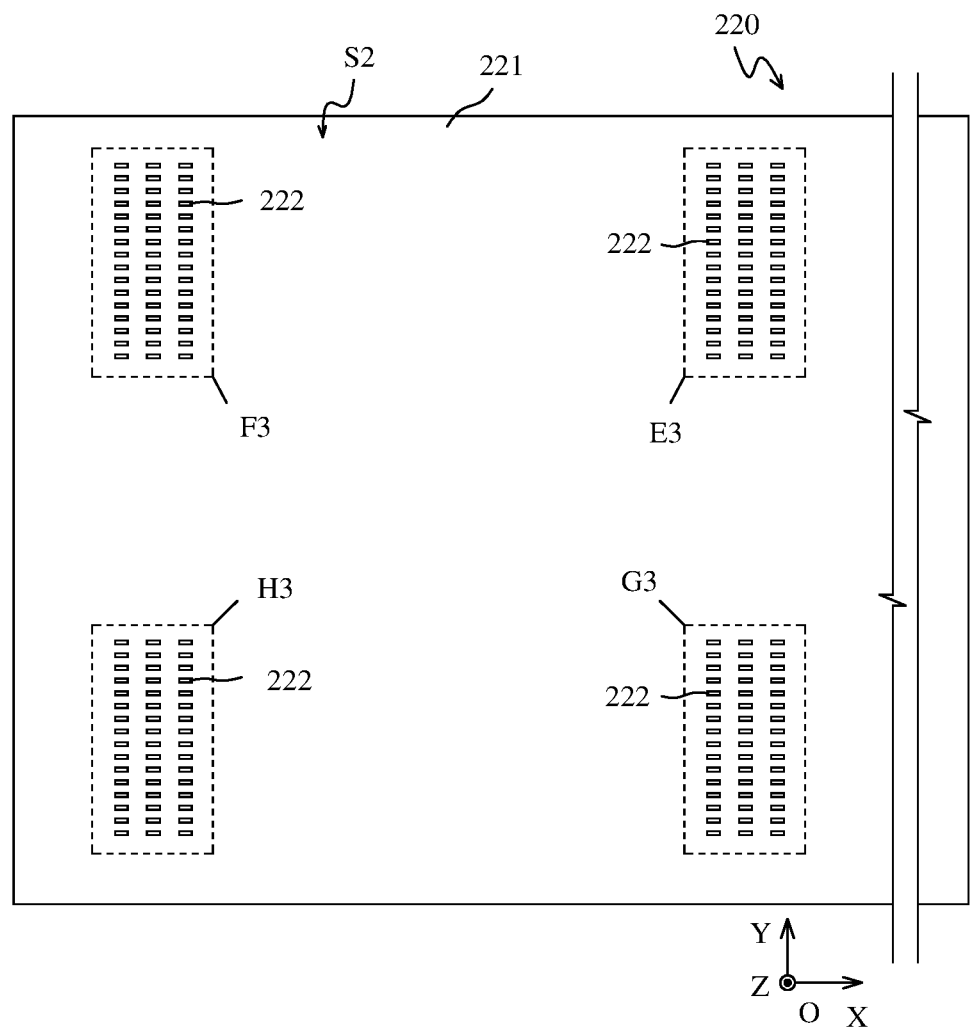

For example, FIG. 7 is a top view of the circuit board 220 in FIG. 4a. The circuit board 220 includes a circuit board body 221 and a plurality of second solder pads 222 distributed on a mount surface S2 (for example, the mount surface S2 is parallel to the XOY surface) of the circuit board body 221. The circuit board body 221 has four areas: an area E3, an area F3, an area G3, and an area H3. The plurality of second solder pads 222 are divided into four groups, and each group of the second solder pads 222 are distributed in an array in one of the four areas. In a specific implementation, the second solder pads 222 use an NSMD (non-solder mask defined pad). Compared with an SMD (solder mask defined pad), the NSMD can better improve position precision of the second solder pads 222, and can reduce a difficulty in soldering the terminals 300 to the second solder pads 222.

Figure 8:
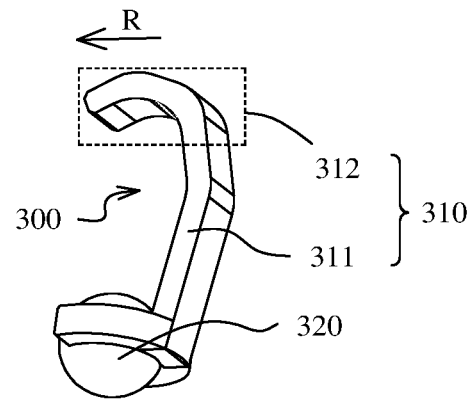
FIG. 8 is a schematic diagram of a structure of a terminal in FIG. 4*a;*

For example, FIG. 8 is a schematic diagram of a structure of a terminal 300 in FIG. 4a. For example, the terminal 300 includes a metal member 310 and a solder ball 320. The metal member 310 includes a first bent part 312 and a strip-shaped (merely an example) body part 311. The first bent part 312 is connected to one end of the body part 311 (for example, an integrated connection), and the solder ball 320 is connected to the other end of the body part 311.

Figure 4B:
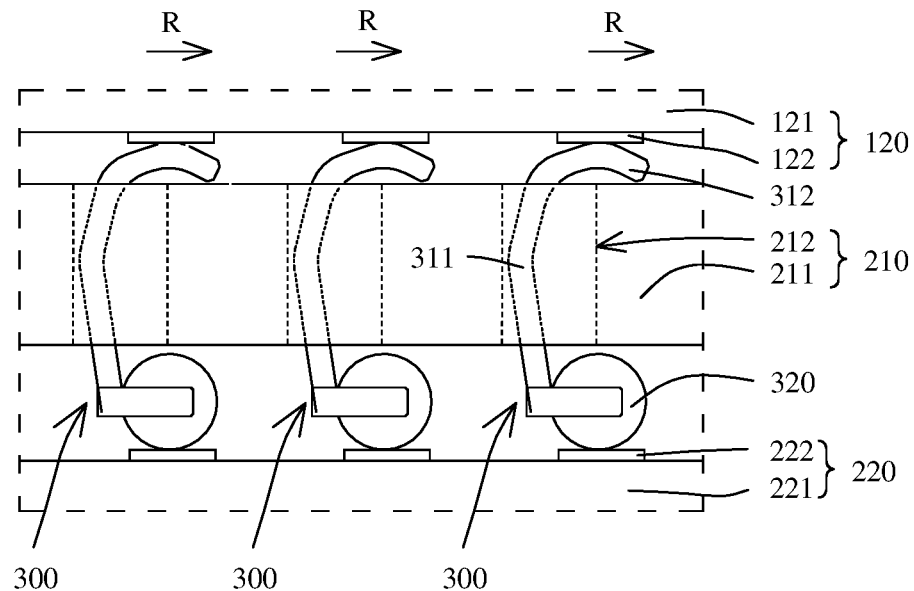
Figure 9:
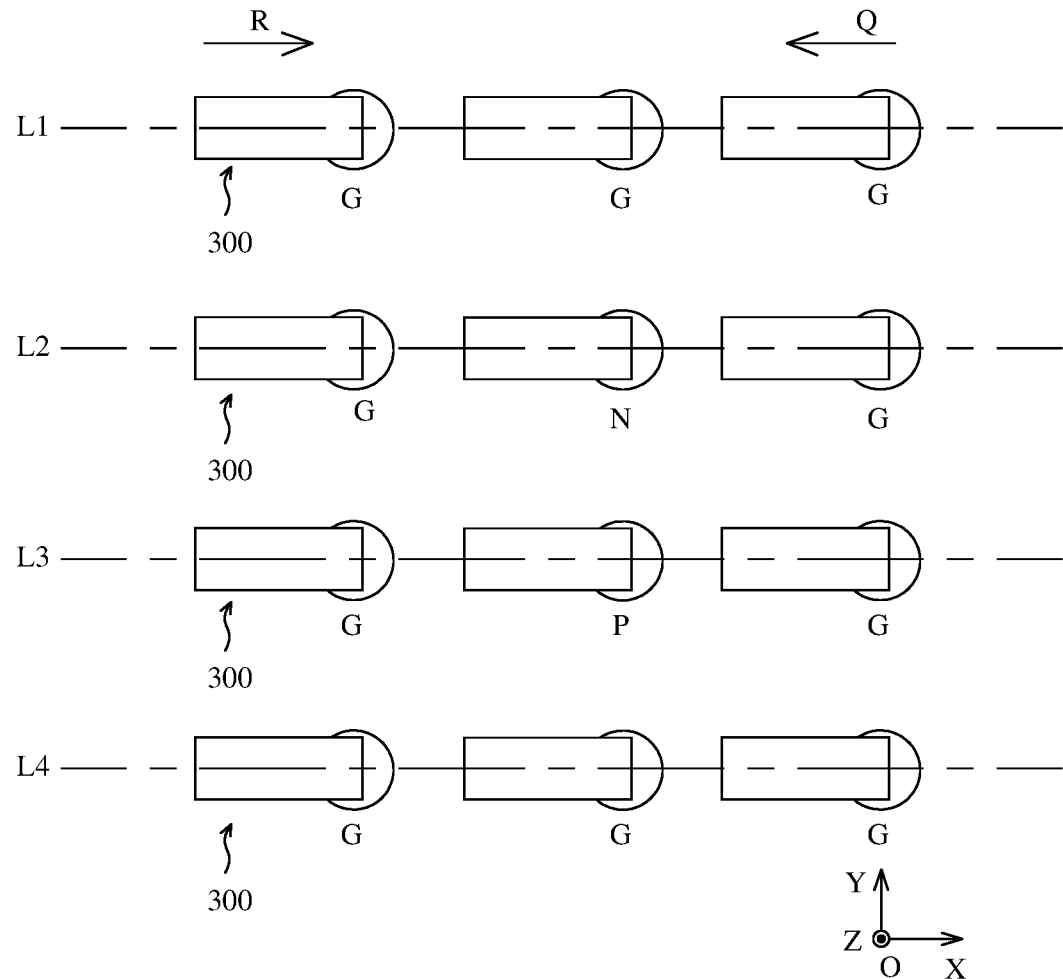
FIG. 9 is an enlarged view of a top view of a plurality of terminals corresponding to terminal fastening cavities in an area E' in FIG. 6.
Figure 10:
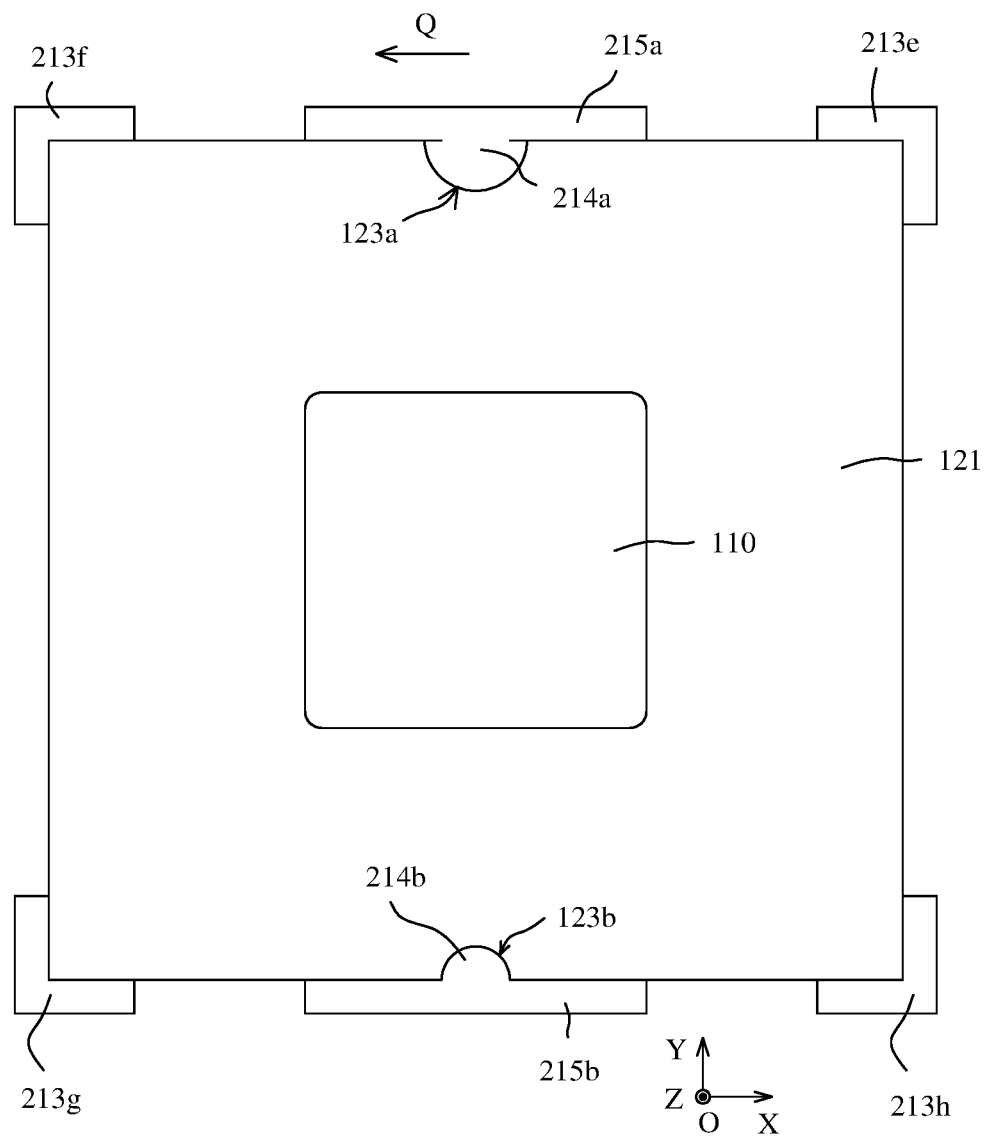
FIG. 10 is a top view of a complex formed by fitting a first component in FIG. 4*a* with a mount base by using a package substrate.

FIG. 4b is a partial enlarged view of a position A in FIG. 4a. With reference to FIG. 4a, FIG. 4b, FIG. 6, and FIG. 8, for example, when the first component 100 and the second component 200 are assembled, one metal member 310 is disposed in each terminal fastening cavity 212 in a portion of or all terminal fastening cavities 212 according to an actual requirement. The body part 311 of the metal member 310 passes through a corresponding terminal fastening cavity 212, and then is fastened to the base body 211. The first bent part 312 is exposed to one side of a top surface of the base body 211 (a surface of the base body 211 in the positive direction of the Z-axis; the top surface is also referred to as a mount surface S3 of the second component 200; and when the first component 100 is mounted on the second component 200, the mount surface S3 is opposite to the first component 100), and then balls are attached to the plurality of metal members 310 fastened to the base body 211, to form the solder ball 320 on one end of the body part 311 away from the first bent part 312. With reference to FIG. 7, the mount base 210 is disposed on a top surface (a surface in the positive direction of the Z-axis) of the circuit board 220, so that the area E2 is opposite to the area E3, the area F2 is opposite to the area F3, the area G2 is opposite to the area G3, and the area H2 is opposite to the area H3. The following uses the area E2 and the area E3 as an example. A plurality of terminal fastening cavities 212 in the area E2 one-to-one correspond to the plurality of second solder pads 222 in the area E3, so that the solder ball 320 in each terminal 300 is in contact with a corresponding second solder pad 222 in the area E3 (FIG. 4b), and then the solder ball 320 is fastened to the corresponding second solder pad 222 through heat treatment. For a manner of disposing terminals 300 in other areas, refer to a manner of disposing the terminals 300 in the area E2. An extension direction of an orthographic projection of the first bent part 312 of each terminal 300 on the mount surface S3 of the second component 200 is defined as an extension direction (represented by R) of the first bent part 312 of the terminal 300. A straight line on which the extension direction R of the first bent part 312 of each terminal 300 is located is parallel to a straight line on which a first preset direction Q (for example, the first preset direction Q is a negative direction of the X-axis) is located, that is, the extension direction R is the same as or opposite to the first preset direction Q. FIG. 9 is an enlarged view of a top view of a plurality of terminals 300 corresponding to terminal fastening cavities 212 in an area E' in FIG. 6. FIG. 9 uses an example in which the extension direction R of the first bent part 312 of each terminal 300 is opposite to the first preset direction Q. Then, the package substrate 120 with the chip 110 is mounted on the mount base 210. First, one end of the substrate body 121 is placed in a groove-shaped space formed by the stopper baffle plates (213e, 213f, 213g, and 213h), the substrate body 121 is pushed along the first preset direction Q until an end part of the substrate body 121 touches the stopper baffle plates 213g and 213f, and then the substrate body 121 is lowered until the bottom surface of the substrate body 121 is parallel to the top surface of the base body 211. In this case, four corners of the substrate body 121 are in one-to-one contact with the stopper baffle plates (213e, 213f, 213g, and 213h) and stopped (refer to FIG. 10). The positioning bump 214a fits with the positioning depression 123a, and the positioning bump 214b fits with the positioning depression 123b, to implement positioning and connection between the substrate body 121 and the mount base 210. Because the positioning bumps (214a and 214b) are disposed in the middle of corresponding sides of the base body 211, compared with an edge of a corresponding side, each group of the terminal fastening cavities 212 are closer to the corresponding positioning bumps (214a and 214b). This reduces an accumulated error of alignment between the terminal 300 and the first solder pad 122, and precisely aligns the first bent part 312 of each terminal 300 with a corresponding first solder pad 122 (refer to FIG. 10). For example, a cross section of each of the positioning bumps (214a and 214b) is semicircular. When the mount base 210 is specifically manufactured, based on a circle center of the cross section of each of the bumps (214a and 214b), a precise position of each terminal fastening cavity 212 may be determined. This improves precision of the position of the terminal fastening cavity 212. In addition, to avoid reversely mounting the package substrate 120 and the mount base 210, outer diameters of the positioning bumps (214a and 214b) may be set to a small value and a large value, and the positioning bumps may also be disposed on the middle of two groups of opposite sides of the base body 211. The positioning depressions on the substrate body 121 are disposed in a similar way. In this case, a position of the first component 100 is referred to as a first specified position, and locked at the first specified position by the stopper baffle plates (213e, 213f, 213g, and 213h) and the positioning bumps (214a and 214b). The area E1 is opposite to the area E2, the area F1 is opposite to the area F2, the area G1 is opposite to the area G2, and the area H1 is opposite to the area H2. The following uses the area E1 and the area E2 as an example. The plurality of terminal fastening cavities 212 in the area E2 one-to-one correspond to the plurality of the first solder pads 122 in the area E3, so that the solder ball 320 in each terminal 300 is in contact with a corresponding first solder pad 122 in the area E2 (FIG. 4b), and a pair of the first solder pad 122 and the second solder pad 222 that are opposite to each other are electrically connected through each terminal 300. In some cases, the first solder pads 122, the second solder pads 222, and the terminal fastening cavities 212 are in a one-to-one correspondence. That is, after the first module 100 and the second module are assembled in a form shown in FIG. 4a, the terminals 300 in each terminal fastening cavity 212 are respectively one-to-one connected to the first solder pads 122 and the second solder pads 222.

In the foregoing process, when the substrate body 121 is pushed along the first preset direction Q, because the substrate body 121 is in direct contact with the first bent part 312 that is exposed to one side of the top surface of the base body 211, in a process that the substrate body 121 moves along the first preset direction Q, the substrate body 121 applies a friction force to the first bent part 312 in contact with the substrate body 121 along the first preset direction Q. Because the extension direction R of the first bent part 312 of each terminal 300 is the same as or opposite to the first preset direction Q, an arm of force of a friction force applied by the substrate body 121 to the first bent part 312 of each terminal 300 is zero, and a torque applied to the first bent part 312 is zero. Therefore, the first bent part 312 is difficult to rotate around the body part 311, and a distance between first bent parts 312 of different terminals 300 is not easily changed. FIG. 9 is still used as an example. As shown in FIG. 9, a terminal 300 marked with P is a P signal terminal, and a terminal 300 marked with N is an N signal terminal, a terminal marked with G is a ground terminal. It can be seen from FIG. 9 that a gap between the P signal terminal and the N signal terminal in a P/N terminal pair is not easily changed, so that impedance of the terminal pair formed by the P signal terminal and the N signal terminal is not easily changed. In addition, it can be learned that a gap between the signal terminals (the P signal terminal and the N signal terminal) in different P/N terminal pairs is also not easily changed, so that crosstalk between different P/N terminal pairs is reduced. In addition, FIG. 9 is still used as an example. In the P/N terminal pair, along an arrangement direction of the P signal terminal and the N signal terminal, a distance D1 between the P signal terminal and an adjacent ground terminal is equal to or close to a distance D2 between the P signal terminal and an adjacent ground terminal. FIG. 9 shows four row standard lines (L1, L2, L3, and L4) that are disposed at equal spacings. Relative to a corresponding row standard line (for example, L3), an offset d1 of a center line of each terminal 300 (for example, the P signal terminal) is less than or equal to d2, where d2 is 0.2 times a minimum value of the following distances: a distance between center lines of first solder pads 122 respectively corresponding to the P signal terminal and the N signal terminal, a distance between center lines of first solder pads 122 respectively corresponding to the P signal terminal and an adjacent ground terminal, and a distance between center lines of first solder pads 122 respectively corresponding to the N signal terminal and an adjacent ground terminal. Even if data is transmitted between the first component 100 and the circuit board 220 at a high speed by using the terminals 300, a signal is not easily distorted, so that SI performance of the electronic module is improved.

It should be noted that it is merely an example in which the straight line on which the extension direction R of the first bent part 312 of each terminal 300 is located is parallel to the straight line on which the first preset direction Q is located. The first bent part 312 of the same terminal 300 is difficult to rotate around a corresponding body part 311 provided that the following conditions are met: Due to the torque generated by the friction force applied by the substrate body 121 to the first bent part 312, the torque applied by the first bent part 312 to the body part 311 is less than or equal to that generated by the body part 311 because of a stress of a material of the body part 311 (the body part 311 is elastic), and the body part 311 is not easily twisted and deformed around an axis of the body part 311. In other words, the torque generated by the friction force applied by the substrate body 121 to the first bent part 312 is less than or equal to that applied by the body part 311 to the first bent part 312. Therefore, the first bent part 312 is difficult to rotate around the axis of the first body part 311.

For example, when the metal member 310 is made of a common material such as copper alloy or phosphor bronze. The included angle between the straight line on which the extension direction R of the first bent part 312 of each terminal 300 is located and the straight line on which the first preset direction Q is located is between 0° and 15°. For example, the included angle may be 0°, 2°, 5°, 7°, 8°, 10°, 11°, 13°, or 15°. In this case, because an arm of force corresponding to the friction force applied by the substrate body 121 to the first bent part 312 is small, the torque generated by the friction force applied by the substrate body 121 to the first bent part 312 is small. Therefore, the torque applied by the first bent part 312 to the body part 311 is insufficient to overcome the torque generated by the stress of the material of the body part 311, and the first bent part 312 is difficult to rotate around the body part 311.

Figure 4C:
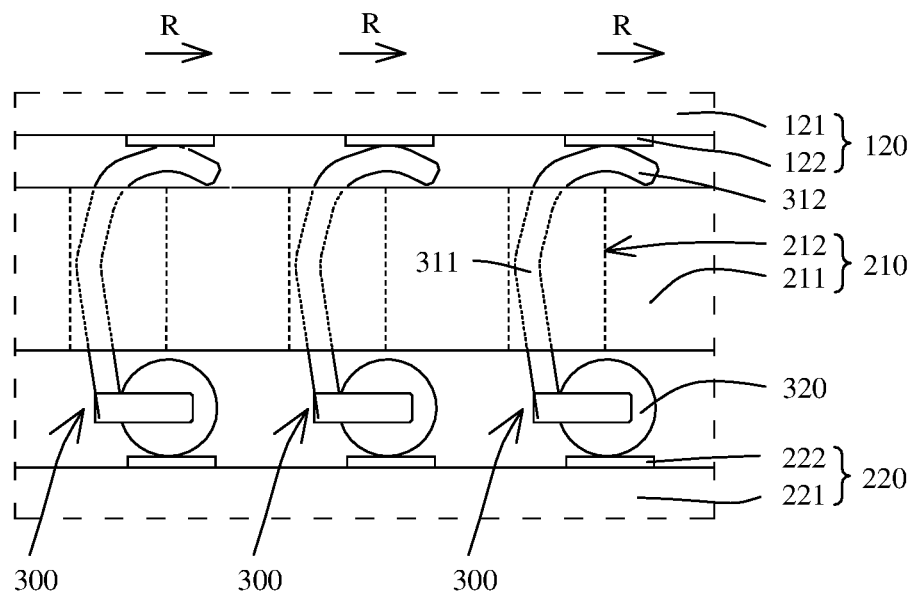

FIG. 4c is a partial enlarged view of a position B in FIG. 4a. With reference to FIG. 4a, FIG. 4b, FIG. 4c, and FIG. 6, the three terminals 300 in FIG. 4b one-to-one correspond to three terminal fastening cavities 212 in a first row in a positive direction of the Y-axis in the area H2 in FIG. 6. The three terminals 300 in FIG. 4c one-to-one correspond to three terminal fastening cavities 212 in a first row in the positive direction of the Y-axis in the area G2 in FIG. 6. Extension directions R of first bent parts 312 of the three terminals 300 in FIG. 4b are consistent with the extension directions R of the first bent parts 312 of the three terminals 300 in FIG. 4c. Other rows of terminals 300 may also be disposed according to the forms of the terminals 300 in FIG. 4b and FIG. 4c.

Figure 11A:
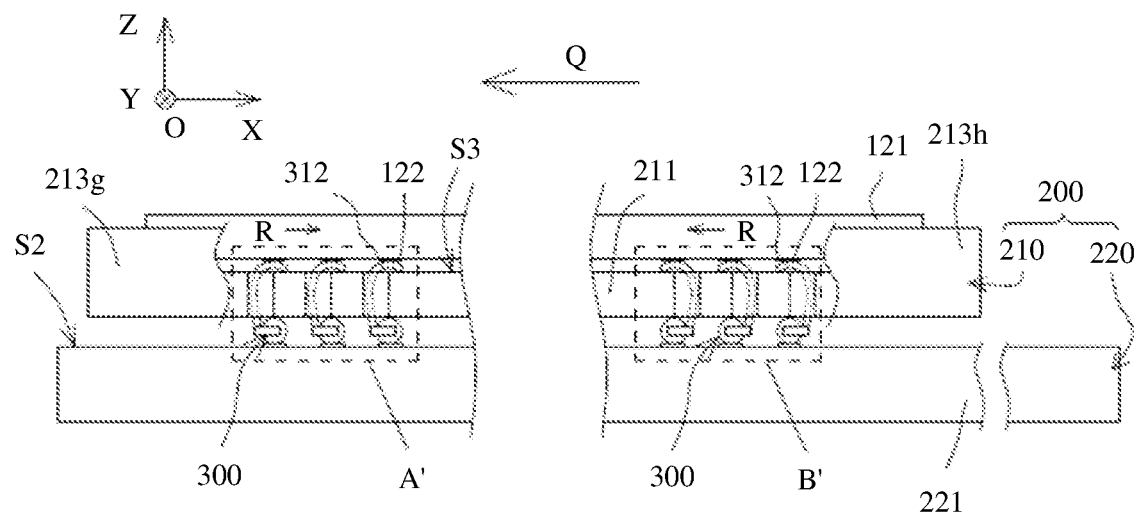
FIG. 11*a* is a partial schematic diagram of another electronic module according to an embodiment of this application.

Compared with the foregoing form, FIG. 11a shows a variation of the electronic module shown in FIG. 4a. Differences between FIG. 11a and FIG. 4a are: The first bent parts 312 of three terminals 300 at a position A' (corresponding to the position A in FIG. 4a) and the first bent parts 312 of three terminals 300 at a position B' (corresponding to the position B in FIG. 4a) are disposed face to face. For example, the extension directions R of the first bent parts 312 of the three terminals 300 at the position A' and the extension directions R of the first bent parts 312 of the three terminals 300 at the position B' are located on a same straight line and opposite to each other. When the package substrate 120 is mounted in the mount base 210, the metal member 310 of each terminal 300 is compressed and deformed by the first solder pad 122. Specifically, for each terminal 300, the first bent part 312 slides along the extension direction R of the first bent part 312, and the body part 311 arches along a direction opposite to the extension direction R of the first bent part 312. Due to elasticity of materials of the body part 311 and the first bent part 312, the first bent part 312 applies a friction force opposite to the extension direction R of the first bent part 312 to a corresponding first solder pad 122. Because the three terminals 300 at the position A' and the three terminals 300 at the position B' are located in a same row, the extension directions R of the first bent parts 312 of the terminals 300 at the two positions A' and B' are opposite, and the first bent parts 312 of the terminals 300 at the two positions A' and B' respectively apply a friction force opposite to the corresponding first solder pads 122, so that friction forces applied to the package substrate 210 as a whole by the terminals 300 at the two positions A' and B' can be offset. This ensures that the package substrate 210 is uniformly stressed. Each first solder pad 122 is not easily misplaced with a corresponding terminal 300, and other rows of terminals 300 may also be disposed according to the forms of the terminals 300 at the positions A' and B'.

Figure 11B:
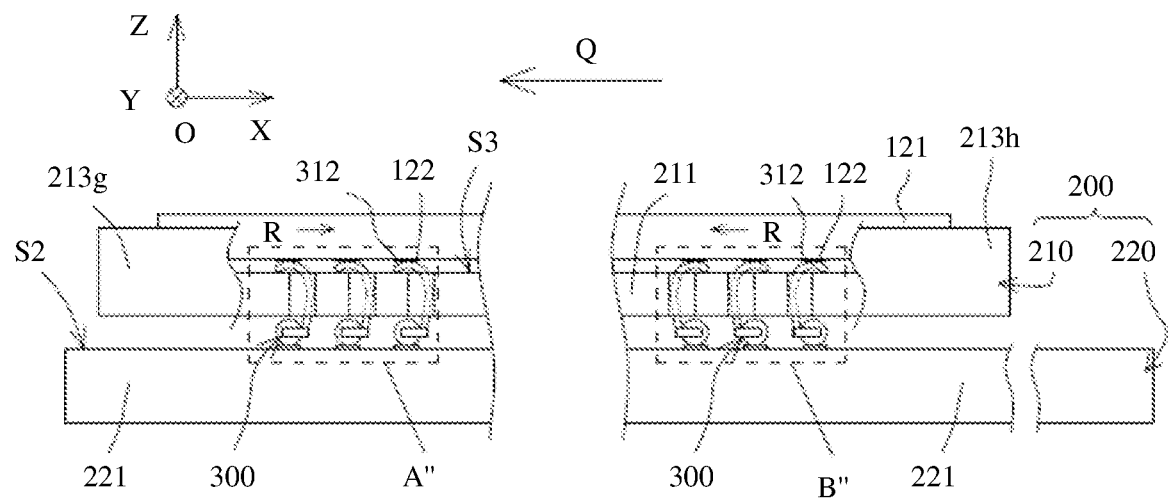
FIG. 11*b* is a partial schematic diagram of another electronic module according to an embodiment of this application.

FIG. 11b shows another variation of the electronic module shown in FIG. 4a. Differences between FIG. 11b and FIG. 11a are: The first bent parts 312 of three terminals 300 at a position A" (corresponding to the position A in FIG. 4a) and the first bent parts 312 of three terminals 300 at a position B" (corresponding to the position B in FIG. 4a) are disposed back to back. For example, the extension directions R of the first bent parts 312 of the three terminals 300 at the position A" and the extension directions R of the first bent parts 312 of the three terminals 300 at the position B" are located on a same straight line and opposite to each other. Therefore, similar to the electronic module in FIG. 11a, friction forces applied to the package substrate 210 as a whole by the terminals 300 at the positions A" and B" can be offset, to ensure that the package substrate 210 is uniformly stressed.

It should be noted that, in FIG. 11a, the first bent parts 312 of the three terminals 300 at the position A' and the first bent parts 312 of the three terminals 300 at the position B' are disposed face to face. Alternatively, an included angle between a straight line on which the extension directions R of the first bent parts 312 of the three terminals 300 at the position A' are located and a straight line on which the first preset direction P is located, and an included angle between a straight line on which the extension directions R of the first bent parts 312 of the three terminals 300 at the position B' are located and the straight line on which the first preset direction P is located may be formed (for example, the included angle may be any one of 5°, 10°, and 15°). In this way, components of the friction forces applied by the first bent parts 312 of the terminals 300 at the positions A' to the package substrate 210 and components of friction forces applied by the first bent parts 312 of the terminals 300 at the positions B' to the package substrate 210 are opposite in the direction of the X-axis, and at least some components can be offset. This ensures that the package substrate 210 is uniformly stressed. Each row of terminals 300 in FIG. 11b may also be disposed in a similar way.

Regardless of the positions A' and B' in FIG. 11a or the positions A" and B" in FIG. 11b, in a same row of the terminals 300 and in each row of the terminals 300, when a quantity of terminals 300 of the first bent parts 312 facing the first preset direction Q is equal to a quantity of terminals 300 of the first bent parts 312 away from the first preset direction Q, the friction forces applied by the same row of the terminals to the package substrate 210 can be fully offset or even completely offset. In addition, the terminals 300 of the first bent parts 312 facing the first preset direction Q are continuously disposed (for example, the terminals 300 at the position B' in FIG. 11a and the terminals 300 at the position A' in FIG. 11b), and the terminals 300 of the first bent parts 312 away from the first preset direction Q are also continuously disposed (for example, the terminals 300 at the position A' in FIG. 11a and the terminals 300 at the position B' in FIG. 11b). This is merely an example of the arrangement manner. For the same row of the terminals 300, when the first solder pads 122 are disposed with a uniform spacing, gaps between the body parts 311 of the terminals 300 with a same extension direction R of the first bent parts 312 and gaps between the first bent parts 312 are uniform, to avoid increase in impedance of a same P/N terminal pair or crosstalk between different P/N terminal pairs, and further improve the SI performance of the electronic module. However, it should be understood that, when the terminals 300 of the first bent parts 312 facing different directions are disposed at a spacing, the package substrate 210 may be uniformly stressed to some extent.

Figure 12:
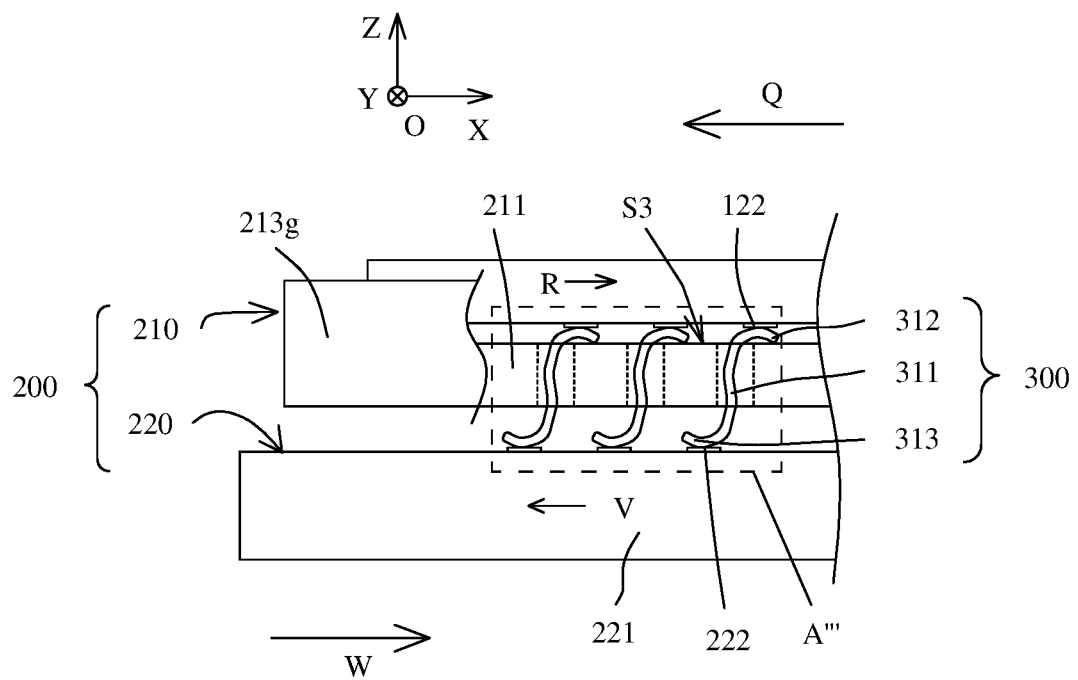
FIG. 12 is a partial schematic diagram of another electronic module according to an embodiment of this application.

FIG. 12 shows another variation of the electronic module shown in FIG. 4a. A position A''' corresponds to the position A in FIG. 4a. Differences between the electronic module in FIG. 12 and the electronic module in FIG. 4a are: The solder ball 320 in each terminal 300 is replaced with the second bent part 313, and the first bent part 312, the second bent part 313, and the body part 311 included in each terminal 300 may be an integrated metal member. Similar to the first bent part 312, an extension direction of an orthographic projection of the second bent part 313 of each terminal 300 on the mount surface S3 of the second component 200 is defined as an extension direction (represented by V) of the second bent part 313 of the terminal 300. When the mount base 210 is assembled to the circuit board 220, generally the base body 211 needs to be pushed to slide by a certain distance relative to the circuit board body 221 along a second preset direction W (for example, a stopper wall extending along the second preset direction W is disposed on the circuit board body 221, and the base body 211 slides along the stopper wall. A structure of fitting the base body 211 with the circuit board body 221 in a sliding manner may be a common conventional technology known in the field, and details are not described herein), and then the base body 211 is locked (may be clamped) at the second specified position relative to the circuit board body 221. For example, a straight line on which the extension direction V of each second bent part 313 is located is parallel to a straight line on which the second preset direction W is located, that is, the extension direction V of a second bent part 313 is the same as or opposite to the second preset direction W. In this case, when the base body 211 is pushed to move along the second preset direction W relative to the circuit board body 221, an arm of force of a friction force applied by the circuit board body 221 to the second bent part 313 is zero. Therefore, the torque of the friction force is insufficient to drive the second bent part 313 to rotate relative to the body part 311. In conclusion, if the terminal 300 is made of a material with good rigidity, or if the extension direction V of the second bent part 313 of the terminal 300 meets a specific requirement, the torque generated by the friction force applied by the substrate body 121 to the second bent part 313 is less than or equal to that applied by the body part 311 to the second bent part 313, and the second bent part 313 is difficult to rotate relative to the body part 311. For example, when the terminal 300 is made of a common material such as copper alloy or phosphor bronze, an included angle between a straight line on which the extension direction V of the second bent part 313 of each terminal 300 is located and a straight line on which the second preset direction W is located is between 0° and 15°. For example, the included angle may be 0°, 2°, 5°, 7°, 8°, 10°, 11°, 13°, or 15°. In this case, the second bent part 313 is difficult to rotate relative to the body part 311, so that the SI performance of the electronic module is improved.

In a specific embodiment, the extension direction R of the first bent part 312 in each terminal 300 may be opposite to the extension direction V of the second bent part 313. For example, when the first preset direction Q is opposite to the second preset direction P, an extrusion and deformation direction of the first bent part 312 is opposite to that of the second bent part 313, and the directions of the friction forces applied to the first bent part 312 and the second bent part 313 are opposite to each other. This ensures that the terminal 300 is uniformly stressed.

Figure 13:
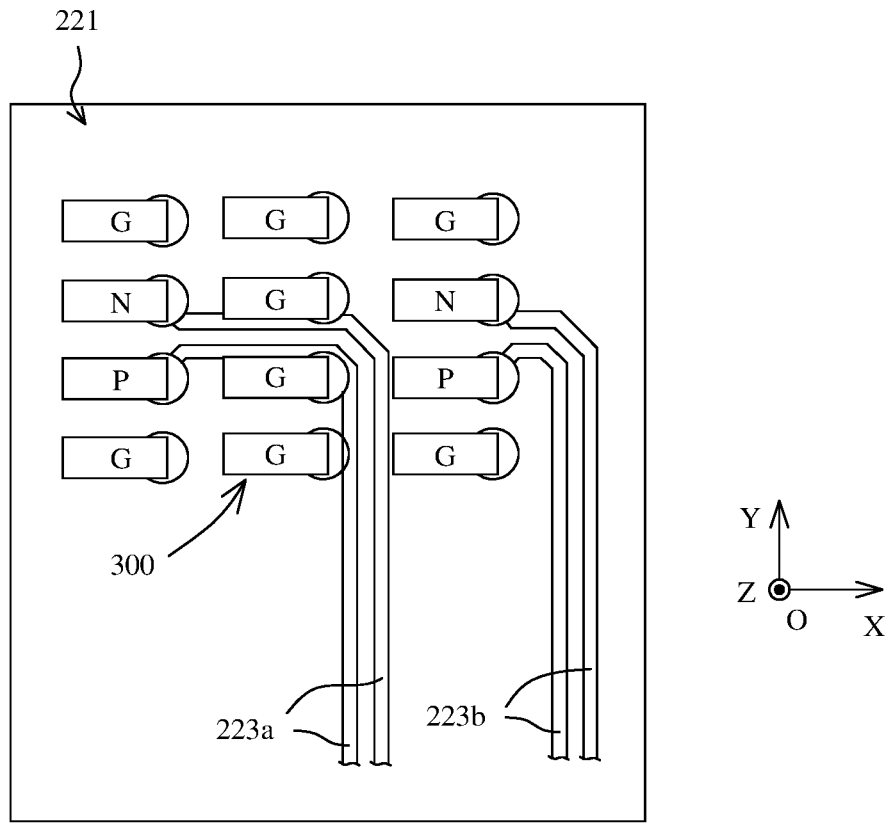
FIG. 13 is a diagram of a position relationship between partial terminals and traces on a circuit board in FIG. 4*a*.

FIG. 13 is a diagram of a position relationship between arrangement of the terminals 300 in the electronic module and traces (for example, 223a and 223b) on the circuit board 220 provided in embodiments of this application. As shown in FIG. 13, the plurality of terminals 300 are distributed in an array on a surface of the circuit board 220. The following uses the traces 223a as an example. A pair of the P signal terminal and the N signal terminal are respectively and electrically connected to the traces 223a on the circuit board body 221. The traces 223a first extend along a positive direction of the X-axis, and in a process of extending along the direction of the X-axis, the traces 223a are parallel to arrangement directions of terminals on two sides (for example, arrangement directions of a P signal terminal in a first column and a third row in FIG. 13 and a ground terminal located in the positive direction of the X-axis of the P signal terminal). Then, the traces 223a extend along the positive direction of the Y-axis, and in a process of extending along the Y-axis, the traces 223a are parallel to arrangement directions of terminals on two sides (for example, arrangement directions of the two ground terminals in the second columns and the third and fourth rows in FIG. 13), and the two traces 223a may extend as a whole along the middle of the terminals on the two sides of the two traces 223a. This prevents the traces 223a from being too close to the terminals 300 on one side, so that performance of the terminals 300 is not affected, and the SI performance of the electronic module is improved. The traces may also be fanned out in only one direction, for example, the traces 223b.

It should be noted that the foregoing first component 100 is not limited to a combination of the chip 110 and the package substrate 120. For example, the form of the first component may also be that a parasitic circuit board fits with the circuit board 220 in the second component 200 by using the terminal 300. In addition, the second component 200 is not limited to a combination of the circuit board 220 and the mount base 210, and may also be another structure of a solder pad (similar to the second solder pad 222) configured to transmit a signal.

Based on a same inventive idea, embodiments of this application further provide an electronic device. The electronic device may be a computer, a mobile phone, a server, or the like. The electronic device includes a storage module and the electronic module provided in the foregoing embodiments. The storage module is electrically connected to the first component in the electronic module ("electrical connection" may be a direct connection or an indirect connection). For example, with reference to FIG. 4a to FIG. 13, the electronic module is disposed, so that when the first component 100 slides relative to the second component 200 along the first preset direction Q, the torque of the friction force applied by the first component 100 to the first bent part 312 of each terminal 300 is less than or equal to that applied by the body part 311 to the first bent part 312, and the first bent part 312 is difficult to rotate relative to the corresponding body part 311. This improves the SI performance of the electronic module and performance of the electronic device. In addition, when the chip 110 is a CPU, the CPU is electrically connected to the storage module, and may read data in the storage module or write data into the storage module.

The foregoing descriptions are merely specific implementations of this application, but are not intended to limit the protection scope of this application. Any variation or replacement readily figured out by persons skilled in the art within the technical scope disclosed in this application shall fall within the protection scope of this application. Therefore, the protection scope of this application shall be subject to the protection scope of the claims.

What is claimed is:

1. An electronic module, comprising:
   a first component and a second component, wherein the first component is fitted with the second component in a sliding manner along a first preset direction, and locked at a first specified position relative to the second component, wherein a surface of the first component facing the second component is provided with a plurality of first solder pads; and
   a plurality of terminals, one-to-one corresponding to at least a portion of the plurality of first solder pads, wherein each terminal comprises a body part and a first bent part connected to the body part, wherein the body part is fastened to the second component, and the first bent part presses against a corresponding first solder pad; and
   the first component and the second component are configured such that, when the first component slides relative to the second component along the first preset direction before said locking at the first specified position relative to the second component, a torque of a friction force applied by the first component to a first bent part of said each terminal is less than or equal to that applied by the body part to the first bent part,
   wherein the first component comprises a package substrate and a chip, the package substrate comprises a substrate body and the plurality of first solder pads, the plurality of first solder pads and the chip are respectively disposed on two opposite surfaces of the substrate body, and the chip is electrically connected to the plurality of first solder pads,
   wherein the second component comprises a circuit board and a mount base, the circuit board comprises a circuit board body and a plurality of second solder pads disposed on the circuit board body,
   wherein the plurality of terminals are one-to-one connected to the plurality of second solder pads,
   wherein the mount base is connected to the circuit board, and body parts of the plurality of terminals pass through the mount base and are fastened to the mount base,
   wherein the circuit board further comprises a plurality of traces formed on the circuit board body, and the plurality of traces and at least a portion of the terminals are in signal connection in a one-to-one correspondence, and when the plurality terminals are distributed in an array, each trace extends along two adjacent columns of terminals and/or a middle position between the two adjacent columns of terminals, and is parallel to an arrangement direction of terminals on two sides of the trace.

2. The electronic module according to claim 1, wherein an included angle between a straight line on which an extension direction of the first bent part of said each terminal is located and a straight line on which the first preset direction is located is between 0° and 15°.

3. The electronic module according to claim 2, wherein the plurality of terminals are distributed in an array; and in each row of terminals distributed along the first preset direction, first bent parts of some terminals and first bent parts of the other terminals are disposed face to face or back to back.

4. The electronic module according to claim 3, wherein in each row of the terminals distributed along the first preset direction, a quantity of terminals of the first bent parts facing the first preset direction is equal to a quantity of terminals of the first bent parts facing away from the first preset direction.

5. The electronic module according to claim 4, wherein in each row of the terminals distributed along the first preset direction, the terminals of the first bent parts facing the first preset direction are continuously disposed, and the terminals of the first bent parts facing away from the first preset direction are continuously disposed.

6. The electronic module according to claim 1, wherein said each terminal further comprises a second bent part that is connected to one end of the body part and that is away from the first bent part, and the second bent part of each terminal presses against one second solder pad;
   the mount base is fitted with the circuit board body in a sliding manner along a second preset direction, and locked in a second specified position relative to the circuit board body; and
   when the mount base slides relative to the circuit board body along the second preset direction, a torque of a friction force applied by the circuit board body to a second bent part of said each terminal is less than or equal to that applied by the body part to the second bent part.

7. The electronic module according to claim 6, wherein an included angle between a straight line on which an extension direction of the second bent part of said each terminal is located and a straight line on which the second preset direction is located is between 0° and 15°.

8. The electronic module according to claim 6, wherein in said each terminal, the extension direction of the first bent part is opposite to the extension direction of the second bent part.

9. The electronic module according to claim 1, wherein in at least one group of two opposite sides of the package substrate, the middle of each side edge is positioned and connected to the mount base.

10. An electronic device, comprising the electronic module according claim 1 and a storage module, wherein the first component is electrically connected to the storage module.

11. A method of forming an electronic module, the method comprising:
    providing a first component of the electronic module, wherein a surface of the first component facing the second component is provided with a plurality of first solder pads;
    providing a second component of the electronic module, the second component having a plurality of terminals, one-to-one corresponding to at least a portion of the plurality of first solder pads, wherein each terminal comprises a body part and a first bent part connected to the body part, and wherein the body part is fastened to the second component and the first bent part presses against a corresponding first solder pad;
    sliding the first component relative to the second component along a first preset direction, thereby applying, by the first component of a first bent part of said each terminal, a torque of a friction force that is less than or equal to that applied by the body part to the first bent part; and
    after the sliding, locking the first component at a first specified position relative to the second component,
    wherein the first component comprises a package substrate and a chip, the package substrate comprises a substrate body and the plurality of first solder pads, the plurality of first solder pads and the chip are respectively disposed on two opposite surfaces of the substrate body, and the chip is electrically connected to the plurality of first solder pads, wherein the second component comprises a circuit board and a mount base, the circuit board comprises a circuit board body and a plurality of second solder pads disposed on the circuit board body, wherein the plurality of terminals are one-to-one connected to the plurality of second solder pads, wherein the mount base is connected to the circuit board, and body parts of the plurality of terminals pass through the mount base and are fastened to the mount base, wherein the circuit board further comprises a plurality of traces formed on the circuit board body, and the plurality of traces and at least a portion of the terminals are in signal connection in a one-to-one correspondence, and when the plurality terminals are distributed in an array, each trace extends along two adjacent columns of terminals and/or a middle position between the two adjacent columns of terminals, and is parallel to an arrangement direction of terminals on two sides of the trace.

\* \* \* \* \*